United States Patent [19]

Park et al.

[11] Patent Number: 5,802,008
[45] Date of Patent: Sep. 1, 1998

[54] WORD LINE DRIVER IN SEMICONDUCTOR MEMORY DEVICE USING A MAIN DECODER AND A PLURALITY OF MIDDLE AND SUB-DECODERS

[75] Inventors: Kee Woo Park; Sang Ho Shin, both of Ichon-shi, Rep. of Korea

[73] Assignee: Hyundai Electronics-Industries Co., Ltd., Ichon-shi, Rep. of Korea

[21] Appl. No.: 777,201

[22] Filed: Dec. 27, 1996

[30] Foreign Application Priority Data

Dec. 29, 1995 [KR] Rep. of Korea ............... 95-66074

[51] Int. Cl.⁶ ................................................. G11C 8/00
[52] U.S. Cl. ............... 365/230.06; 365/227; 365/185.23
[58] Field of Search ............................. 365/230.06, 227, 365/185.23

[56] References Cited

U.S. PATENT DOCUMENTS 4,651,031  3/1987  Kamuro .................. 326/107
5,351,217  9/1994  Jeon ..................... 365/230.06
5,377,156  12/1994 Watanabe et al. ........... 365/227

Primary Examiner—David C. Nelms
Assistant Examiner—Andrew Q. Tran
Attorney, Agent, or Firm—Reid & Priest LLP

[57] ABSTRACT

A word line driver in a semiconductor memory device. The driver has first to $(2^{m-n})$th middle decoding units for commonly inputting an address signal of n bit and for outputting metal control signals by $2^n$ so as to selectively drive $2^m$ word lines by dividing them by $2^n$; a main decoding unit for selectively driving the first to (m-n)bits th middle decoding units by an address signal of (m-n) bits; and first to $(2^{m-n})$th sub decoding units for commonly inputting a high voltage via a metal power line, and after coupled with $2^n$ word lines of the $2^m$ word lines of the cell array block, for selectively applying the high voltage to the $2^n$ word lines to selectively drive them according to logic signals of $2^n$ metal control lines, the first to $(2^{m-n})$th sub decoding units being coupled with the first to $(2^{m-n})$th middle decoding units and the $2^n$ metal control lines, respectively.

5 Claims, 4 Drawing Sheets

WORD LINE DRIVER IN SEMICONDUCTOR MEMORY DEVICE USING A MAIN DECODER AND A PLURALITY OF MIDDLE AND SUB-DECODERS

BACKGROUND OF THE INVENTION

1. Field of the Invention

The present invention relates to a word line driver in a semiconductor memory device, and particularly to a word line driver capable of preventing a malfunction of the semiconductor memory device and minimizing the load of capacitors.

2. Description of the Prior Art

In general, as integration in semiconductor memory devices increases, the number of word lines is increased and the number of address signals designating the word lines is also increased. Further, the semiconductor memory device has a word line driver which divides the address signals by the constant bit, and then decodes the address signals. The word line driver increases the load of the capacity between distribution by switching high voltage according to the result of the divided decoding. However, this increases consumption of current in the semiconductor memory device, and also causes the semiconductor memory device to malfunction. The word line driver according to the prior art will be explained with respect to FIGS. 1 and 2.

Referring to FIG. 1, the word line driver according to the prior art is composed of a cell array block 10 having $2^m$ word lines and the first to $(2^{m-n})$th sub row decoders SD1 to $SD2^{M-N}$ for driving the $2^m$ word lines. The first to $(2^{m-n})$ th sub row decoders SD1 to $SD2^{M-N}$ selectively drive the word lines of the cell array block 10.

The word line driver according to the prior art further comprises a first main row decoder 12 for inputting row addresses of (m-n) bits and a second main row decoder 14 for inputting address signals of n bits.

The first main row decoder 12 provides a high logic signal to any one of the first to $(2^{m-n})$th true metal selection lines according to logic values of the row address signals of (m-n) bits to selectively drive the first to $(2^{m-n})$th sub row decoders SD1 to $SD2^{m-n}$. The high logic signal provided to any one of the first to $(2^{m-n})$ true metal selection lines has a voltage Vdd of low potential. Further, $2^{m-n}$ inverters are connected between the first to $(2^{m-n})$th true metal selection lines MSL1 to $MSL2^{m-n}$ and the first to $(2^{m-n})$th complementary metal selection lines MSL1b to $MSL2^{m-n}$b. The $2^{m-n}$ inverters INV1 $2^{m-n}$ reverse the logic signals on the first to $(2^{m-n})$th true metal selection lines MSL1 to $MSL2^{m-n}$, respectively. Thereby, a low logic signal having ground potential is applied to only the complementary metal selection line corresponding to the row address signal of (m-n) bits among the first to $(2^{m-n})$th complementary metal selection lines MSL1b to $MSL2^{m-n}$b. However, the high logic signal having the low potential Vdd is applied to the rest of the complementary metal selection lines.

In the meantime, the second main row decoder 14 provides a voltage of high potential to any one of the first to $(2^n)$th metal power lines $\phi X1$ to $\phi X2^n$ according to logic values of the row address signals of n bits to drive any one of the $2^m$ word lines of the cell array block 10. The first to $(2^n)$th metal power lines $\phi X1$ to $\phi X2^n$ are connected in common to the first to $(2^{m-n})$th sub row decoders SD1 to $SD2^{M-N}$.

Any one of the sub row decoders receiving the high logic signal from the true metal selection lines couples the $2^n$ metal power lines $\phi X1$ to $\phi X2^n$ with the $2^n$ of the cell array block 10 by means of the logic signals on the true metal selection lines, thereby driving any one of the $2^n$ word lines.

FIG. 2 is a detailed circuit diagram of the sub row decoder of FIG. 1. Referring to FIG. 2, the sub row decoder has the first to $(2^n)$th pull-up transistors TPU1 to $TPU2^n$ each connected between the first to $(2^n)$th metal power lines $\phi X1$ to $\phi X2^n$ and the first to $(2^n)$th word lines WL1 to $WL2^n$. In case that the high logic signal is applied from the true metal selection line MSLi, the first to $(2^n)$th pull-up transistors TPU1 to $TPU2^n$ are turned on to couple the first to $(2^n)$th metal power lines $\phi X1$ to $\phi X2^n$ with the first to $(2^n)$th word lines WL1 to $WL2^n$, respectively. Thereby, only one word line coupled with the metal power selection line to which the high potential Vpp is provided is driven.

In the meantime, the first to $(2^n)$th boosting transistors TB1 to $TB2^n$ coupled between the true metal selection line MSLi and gates of the first to $(2^n)$th pull-up transistors TPU1 to $TPU2^n$, boost the voltage level of the logic signal on the true metal selection line MSLi. The first to $(2^n)$th boosting transistors TB1 to $TB2^n$ provide the boosted logic signals to the first to $(2^n)$th pull-up transistors TPU1 to $TPU2^n$.

The sub row decoder further has the first to $(2^n)$th pull-down transistors TPD1 to $TPD2^n$ each connected between the first to $(2^n)$th word lines WL1 to $WL2^n$ and the ground voltage Vss. In the case that the high logic signal is applied from the complementary metal selection line MSLib, the first to $(2^n)$th pull-down transistors TPD1 to $TPD2^n$ are turned on. Thereby, all of the first to $(2^n)$th word lines WL1 to $WL2^n$ are coupled with the ground voltage Vss and they are not driven thus.

As mentioned above, the word line driver according to the prior art has a plurality of the metal power lines for high voltage, which are connected in common to the sub row decode arrays to increase the load of capacitors of the semiconductor memory device. This results from the fact that the metal power selection lines function as capacitors. Accordingly, the word line driver according to the prior art increases the unnecessary consumption of current in the semiconductor memory device and causes a malfunction of the semiconductor memory.

SUMMARY OF THE INVENTION

Therefore, the present invention is to provide a word line driver capable of minimizing the load of capacitors in semiconductor memory devices and preventing malfunction of the semiconductor memory devices.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve the above object in accordance with the present invention, as embodied and broadly described, the word line driver in the semiconductor memory device comprises first to $(2^{m-n})$th middle decoding units for commonly inputting an address signal of n bits and for outputting metal control signals by $2^n$ so as to selectively drive $2^m$ word lines by dividing them by $2^n$; a main decoding unit for selectively driving the first to $(2^{m-n})$th middle decoding units by an address signal of $(2^{m-n})$ bits; and first to $(2^{m-n})$th sub decoding units for commonly inputting a high voltage via a metal power line, and after coupled with $2^n$ word lines of the $2^m$ word lines of the cell array block, for selectively applying the high voltage to the $2^n$ word lines to selectively drive them according to logic signals of $2^n$ metal control lines, the first to $(2^{m-n})$th sub decoding units being coupled with the first to $(2^{m-n})$th middle decoding units and the $2^n$ metal control lines, respectively.

It is to be understood that both the foregoing general description and the following detailed description are exemplary and explanatory and are intended to provide further explanation of the invention as claimed.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENTS

Reference will now be made in detail to the preferred embodiments of the present invention, examples of which are illustrated in the accompanying drawings.

Figure 1:
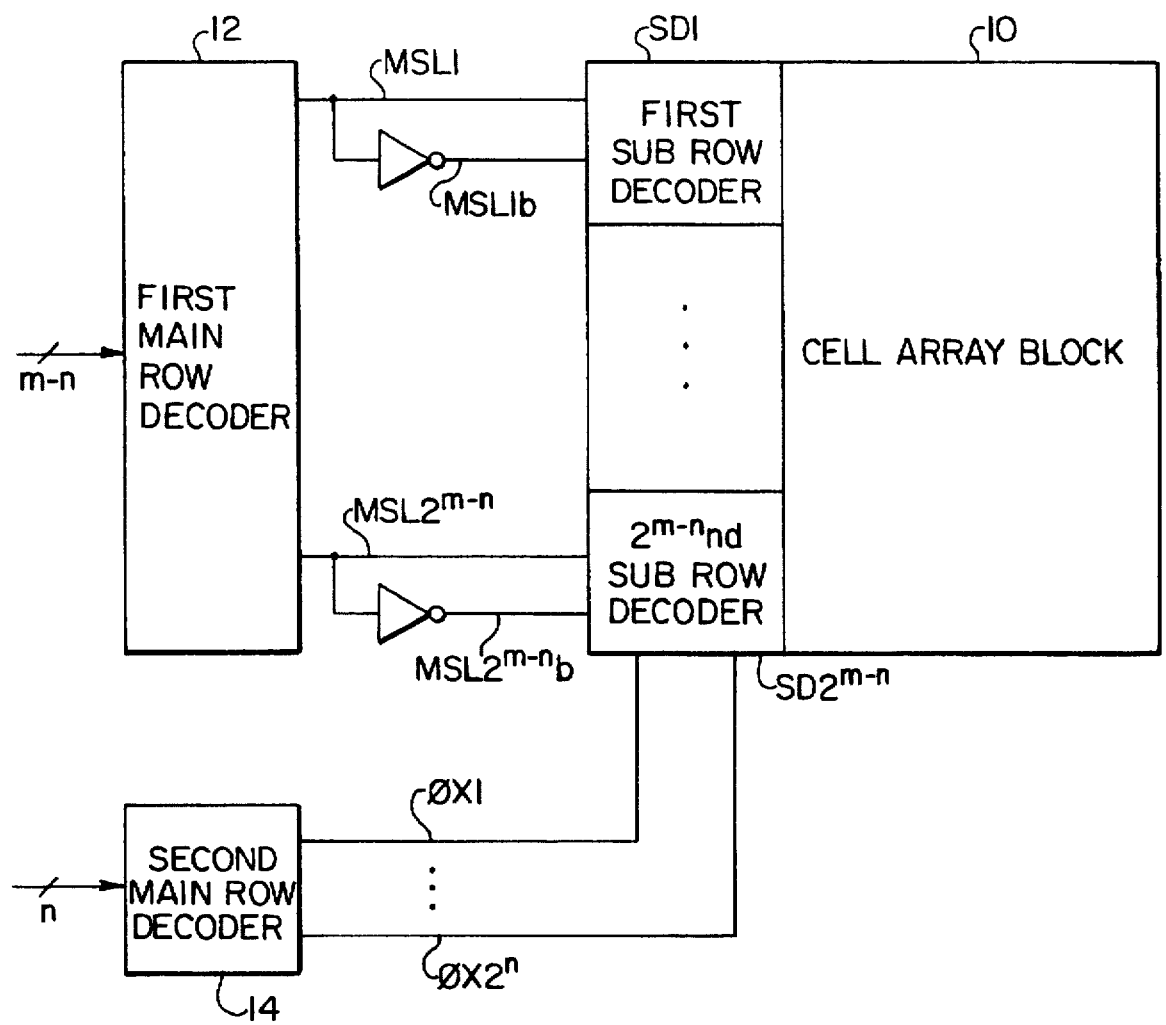
FIG. 1 is a block diagram of a word line driver in a semiconductor memory device according to the prior art.
Figure 2:
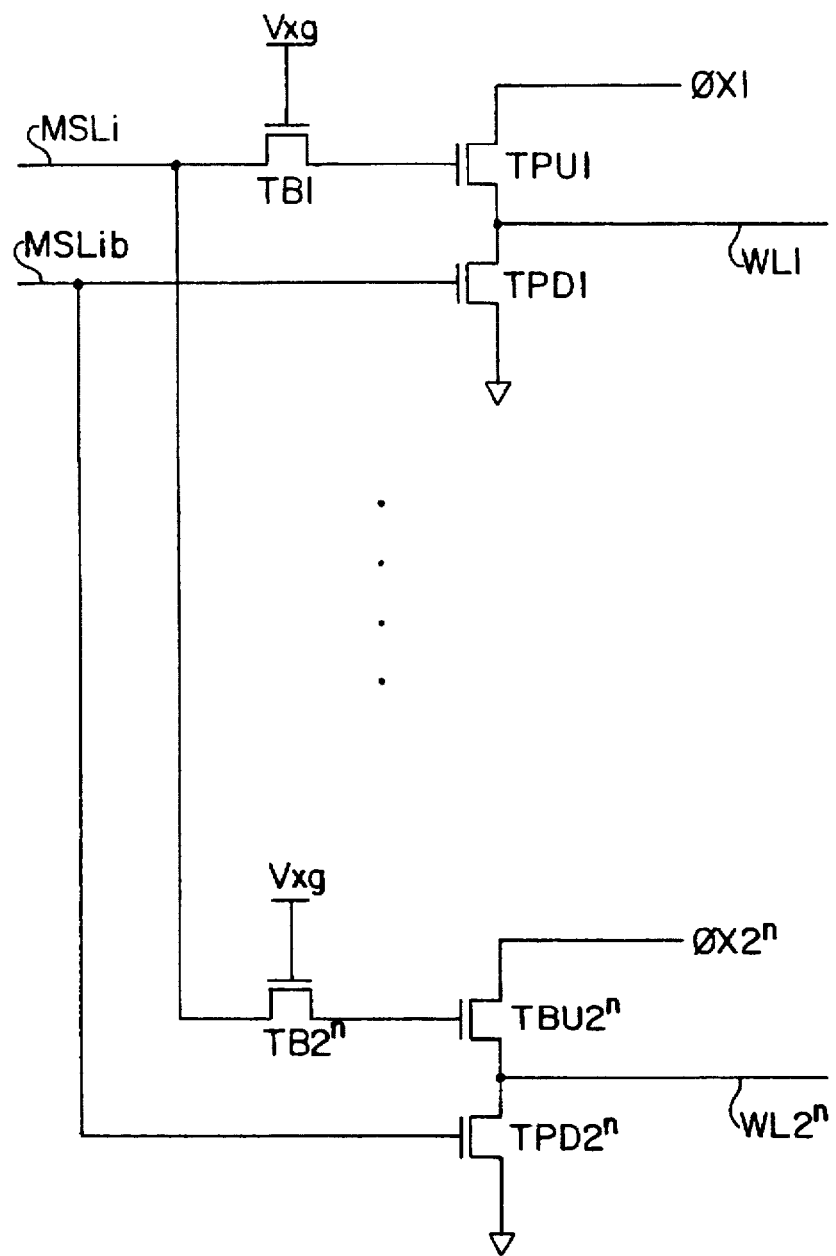
FIG. 2 is a detailed circuit diagram of a sub row decoder of FIG. 1.
Figure 3:
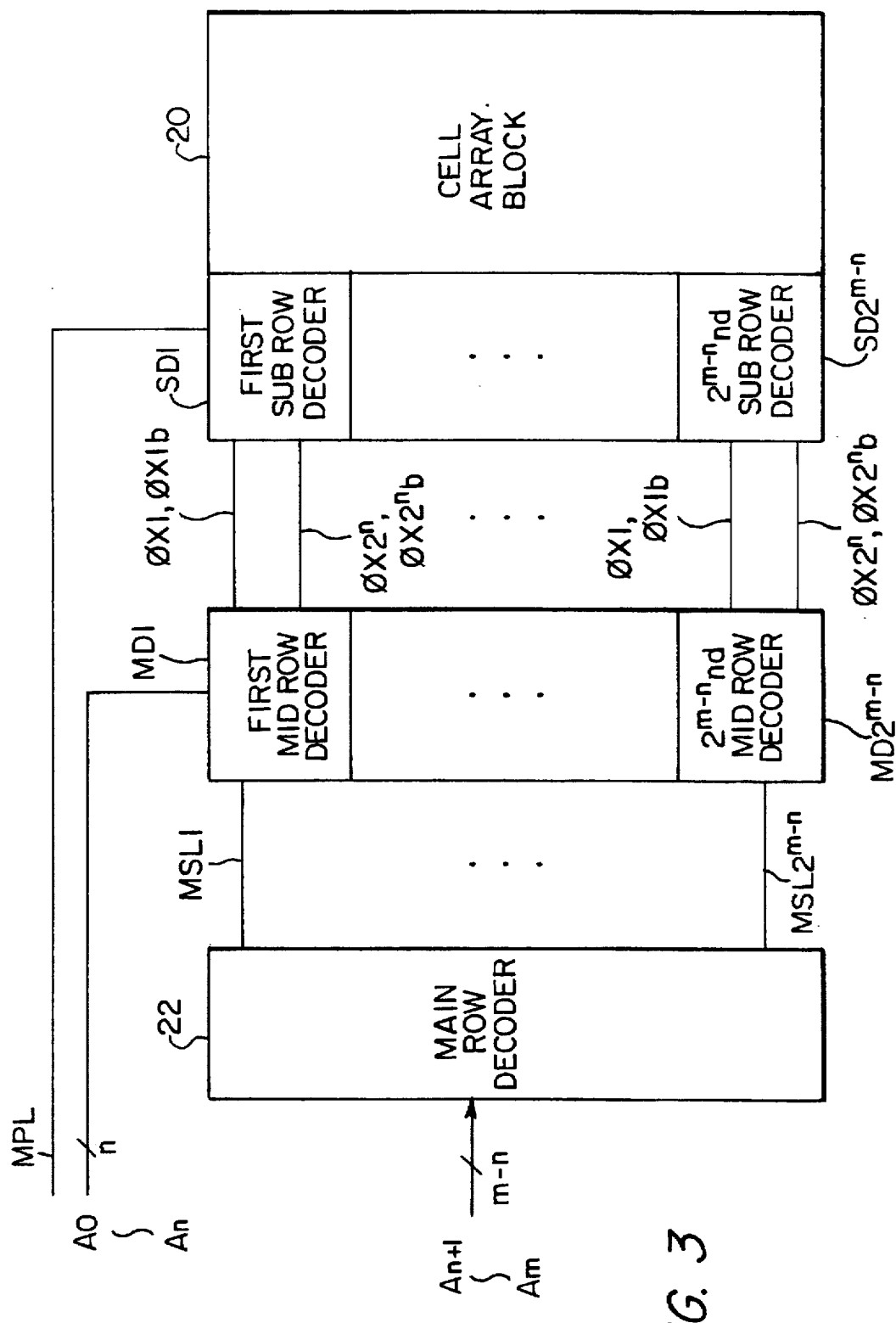
FIG. 3 is a block diagram of a word line driver in a semiconductor memory device according to embodiment of the present invention.

Referring to FIG. 3, the word line driver in the semiconductor memory device according to the embodiment of the present invention, has a cell array block 20 having $2^m$ word lines and the first to $(2^{m-n})$th sub row decoders SD1 to SD2$^{M-N}$ for driving the $2^m$ word lines. Each of the first to $(2^{m-n})$th sub row decoders SD1 to SD2$^{M-N}$ selectively drives $2^n$ word lines at a time. The first to $(2^{m-n})$th sub row decoders are coupled with the metal power lines MPL in common. Further, the first to $(2^{m-n})$th sub row decoders SD1 to SD2$^{M-N}$ apply the high voltage Vpp to the $2^n$ word lines from the metal line MPL to drive any one of the $2^n$ word lines.

The word line driver further has a main row decoder 22 for inputting row addresses of (m-n) bits and the first to $(2^{m-n})$th middle row decoders MD1 to MD2$^{m-n}$ for commonly inputting row address signals of n bits.

The first main row decoder 22 provides the high logic signal to any one of the first to $(2^{m-n})$th metal selection lines MSL1 to MSL2$^{m-n}$ according to logic values of the row address signals of (m-n) bits to selectively drive the first to $(2^{m-n})$th middle row decoders MD1 to MD2$^{m-n}$. The high logic signal provided to any one of the first to $(2^{m-n})$ metal selection lines MSL1 to MSL2$^{m-n}$ has a voltage Vdd of low potential.

The first to $(2^{m-n})$th middle row decoders MD1 to MD2$^{m-n}$ are connected to the first to $(2^{m-n})$th metal selection lines MSL1 to MSL2$^{m-n}$, respectively. Further, the first to $(2^{m-n})$th middle row decoders have the first to $(2^n)$th metal control lines $\phi X1$ to $\phi X2^n$. For example, the first middle row decoder MD1 is coupled with the first sub row decoder SD1 via the $2^n$ metal control lines $\phi X1$ to $\phi X2^n$. In the same manner, the second to $(2^{m-n})$th middle row decoders MD2 to MD2$^{m-n}$ are each coupled with the second to $(2^{m-n})$th sub row decoders SD2 to SD2$^{m-n}$ via the metal control lines by $2^n$.

Moreover, the first to $(2^{m-n})$th middle row decoders MD1 to MD2$^{m-n}$ selectively perform an address decoding operation according to a fact that the high logic signal is generated in any of the first to $(2^{m-n})$th metal selection lines MSL1 to MSL2$^{m-n}$. During the decoding operation, the first to $(2^{m-n})$th middle row decoders MD2 to MD2$^{m-n}$ provide the high logic signal to only the metal control line corresponding to the logic value of the row address signal of n bits among the $2^n$ metal control lines $\phi X1$ to $\phi X2^n$.

For example, in case that the high logic signal is generated in the first metal selection line MSL1, the first middle row decoder MD1 decodes the row address signal of n bits. The first middle row decoder MD1 applies the high logic signal to any one of the first to $(2^n)$th metal control lines $\phi X1$ to $\phi X2^n$ according to the logic value of the row address signal of n bits to designate the word line to be driven by the first sub row decoder SD1. At this time, if the high logic signal is applied to the first metal control line, the first sub row decoder SD1 is subjected to provide high voltage to only the first word line of $2^n$ word lines from the metal power line MPL to thereby drive the first word line.

In the same manner, the first to $(2^{m-n})$th middle row decoders MD1 to MD2$^{m-n}$ control the first to $(2^{m-n})$th sub row decoders SD1 to SD2$^{m-n}$, respectively. The high logic signal provided to the metal control lines $\phi X1$ to $\phi X2^n$ has the low potential Vdd.

Figure 4:
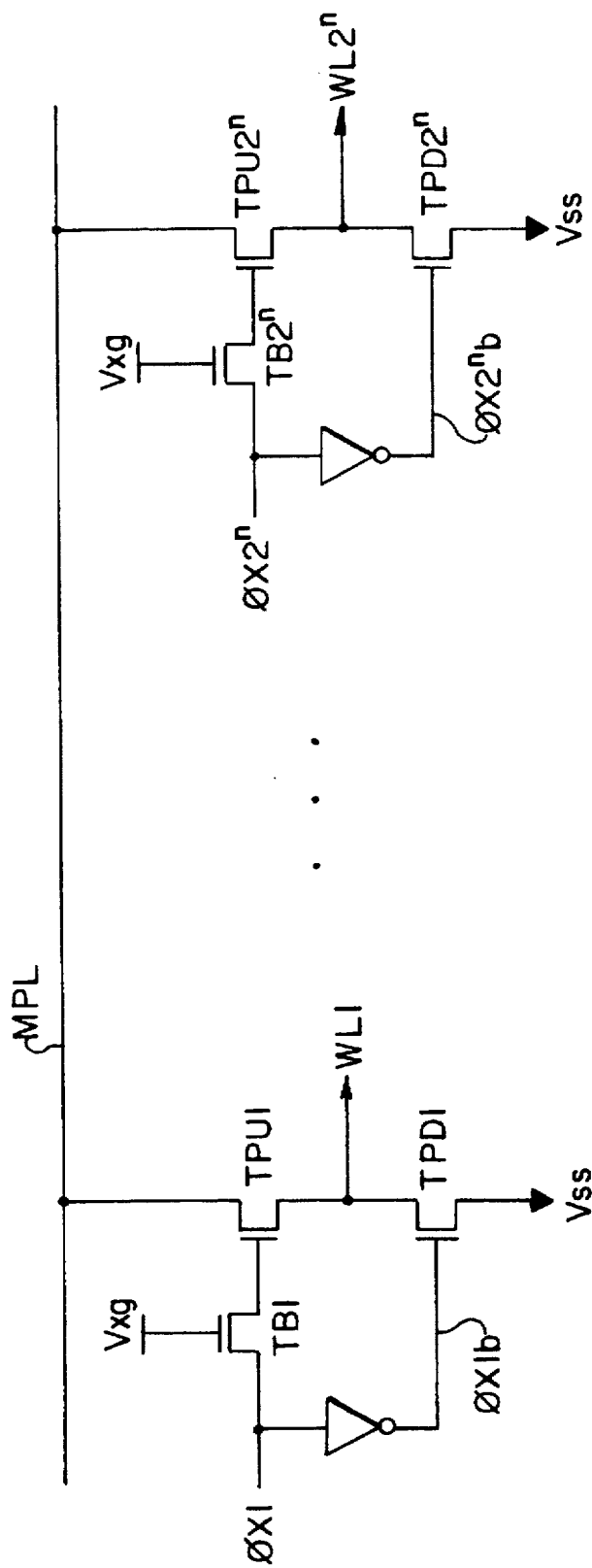
FIG. 4 is a detailed circuit diagram of a sub row decoder of FIG. 3.

FIG. 4 is a detailed circuit diagram of the sub row decoder of FIG. 3. Referring to FIG. 4, the sub row decoder has the first to $(2^n)$th pull-up transistors TPU1 to TPU2$^n$ each connected between the first to $(2^n)$th metal power lines and the first to $(2^n)$th word lines WL1 to WL2$^n$. Gates of the first to $(2^n)$th pull-up transistors TPU1 to TPU2$^n$ are connected to the first to $(2^n)$th true metal control lines $\phi X1$ to $\phi X2^n$, respectively. Further, the first to $(2^n)$th pull-up transistors TPU1 to TPU2$^n$ are turned on according to a fact that the high logic signal of the low voltage is applied to any of the first to $(2^n)$th true metal control lines $\phi X1$ to $\phi X2^n$. Thereby, any one of the first to $(2^n)$th word lines WL1 to WL2$^n$ is driven.

For example, when the high logic signal is provided to the first metal control line, only the first pull-up transistor TPU1 is turned on to apply the high voltage on the metal power line MPL to the first word line WL1. Therefore, the first word line is driven by the high voltage from the first pull-up transistor TPU1.

In the meantime, the first to $(2^n)$th boosting transistors TB1 to TB2$^n$ coupled between the first to $(2^n)$th true metal control lines and the gates of the first to $(2^n)$th pull-up transistors TPU1 to TPU2$^n$, boost the voltage level of the logic signal on the first to $(2^n)$th true metal control lines $\phi X1$ to $\phi X2^n$. The first to $(2^n)$th boosting transistors TB1 to TB2$^n$ provide the boosted logic signals to the first to $(2^n)$th pull-up transistors TPU1 to TPU2$^n$. Gates of the first to $(2^n)$th boosting transistors TB1 to TB2$^n$ are provided with a boost control voltage Vxg in common. The boost control voltage Vxg is at least as high as the high voltage Vpp.

Furthermore, the sub row decoder has the first to $(2^n)$th pull-down transistors TPD1 to TPD2$^n$ each connected between the first to $(2^n)$th word lines WL1 to WL2$^n$ and the ground voltage Vss. In case that the high logic signal is applied from the first to $(2^n)$th complementary metal control lines $\phi X1b$ to $\phi X2^nb$, the first to $(2^n)$th pull-down transistors TPD1 to TPD2$^n$ are all turned on. Thereby, all of the first to $(2^n)$th word lines WL1 to WL2$^n$ are coupled with the ground voltage Vss and are not driven. The first to $(2^n)$th pull-up transistors TPU1 to TPU2$^n$ use NMOS transistors as the first to ($2^n$)th pull-down transistors TPD1 to TPD$2^n$ and the first to ($2^n$)th boosting transistors TB1 to TB$2^n$.

Further, $2^{m-n}$ inverters INV1 to INV$2^{m-n}$ connected between the first to ($2^{m-n}$)th true metal control lines and the first to ($2^{m-n}$)th complementary metal control lines, reverse the logic signals on the first to ($2^{m-n}$)th true metal control lines φX1 to φX$2^n$, respectively. Thereby, the low logic signal having the ground potential is applied to only the complementary metal control line corresponding to the row address signal of n bits among the first to ($2^{m-n}$)th complementary metal control lines. However, the high logic signal the low potential] Vdd is applied to the rest of the complementary metal control lines.

As mentioned above, the word line driver according to the present invention is employed to minimize the load of capacitors for the high voltage Vpp by making it one of the power supply lines coupled with the sub row decoder. As a result, the word line driver of the present invention can stabilize the high voltage Vpp and minimize the consumption of current of semiconductor memories.

Further, the word line driver of the present invention can prevent a short-circuit phenomenon between the metal power lines through strapping in the sub row decoders. Also, the word line driver can prevent malfunction of the semiconductor memory device.

It will be apparent to those skilled in the art that various modifications and variations can be made on the word line driver of the semiconductor memory device of the present invention without departing from the spirit or scope of the invention. Thus, it is intended that the present invention cover the modifications and variations of this invention provided that they come within the scope of the appended claims and their equivalents.

What is claimed is:

1. A word line driver for minimizing a capacitive effect of word lines in a semiconductor memory device formed with a cell array block having $2^m$ word lines, the word line driver comprising:

a) first through ($2^{m-n}$)th middle decoding means for commonly receiving an n-bit address signal, each of the middle decoding means constituting means for outputting $2^n$ metal control signals on $2^n$ respective metal control lines so that the ($2^{m-n}$) middle decoding means selectively drive the $2^m$ word lines in groups of $2^n$;

b) main decoding means, coupled to the first to ($2^{m-n}$)th middle decoding means, for selectively driving the first to (m-n)-bit th middle decoding means by a (m-n)-bit address signal; and c) first through ($2^{m-n}$)th sub decoding means, coupled with $2^n$ word lines of the $2^m$ word lines of the cell array block, and coupled with respective ones of the first to ($2^{m-n}$)th middle decoding means via the $2^n$ metal control lines, the sub decoding means including:

c1) means for commonly inputting a high voltage via a metal power line; and c2) means for selectively applying the high voltage to the $2^n$ word lines to selectively drive them according to logic signals on the $2^n$ metal control lines.

2. The word line driver as claimed in claim 1, wherein the sub decoding means include:

$2^n$ transistor means for switching the high voltage to the $2^n$ word lines from the metal power line, in response to each of the logic signals from the $2^n$ metal control lines.

3. The word line driver as claimed in claim 2, wherein the $2^n$ transistor means for switching include:

$2^n$ boosting transistor means for boosting each of the logic signals from the $2^n$ metal control lines.

4. The word line driver as claimed in claim 2, further comprising:

$2^n$ inverter means for inverting respective logic signals on the $2^n$ metal control lines; and $2^n$ transistor means for switching ground voltages to the $2^n$ word lines, in response to the $2^n$ inverter means.

5. The word line driver as claimed claim 1, wherein:

the logic signals provided to the $2^n$ metal control lines have voltages of low potential.

* * * * *